(12) United States Patent
Kureishi et al.

(10) Patent No.: US 6,740,208 B2
(45) Date of Patent: May 25, 2004

(54) PHOTO MASK BLANK AND METHOD OF MANUFACTURING THE SAME

(75) Inventors: Mitsuhiro Kureishi, Akishima (JP); Osamu Nozawa, Fuchu (JP)

(73) Assignee: Hoya Corporation, Tokyo (JP)

( * ) Notice: Subject to any disclaimer, the term of this patent is extended or adjusted under 35 U.S.C. 154(b) by 187 days.

(21) Appl. No.: 09/996,579

(22) Filed: Nov. 30, 2001

(65) Prior Publication Data

US 2002/0068228 A1 Jun. 6, 2002

(30) Foreign Application Priority Data

Dec. 1, 2000 (JP) ........................................ 2000-367837

(51) Int. Cl.$^7$ .................... C23C 14/34; C23C 14/00; G03F 9/00
(52) U.S. Cl. ..................... 204/192.12; 430/5; 427/523
(58) Field of Search .................. 204/192.11, 192.12; 430/5; 427/523

(56) References Cited

U.S. PATENT DOCUMENTS

2002/0197509 A1 * 12/2002 Carcia et al. ............... 428/689

* cited by examiner

*Primary Examiner*—Steven Versteeg
(74) *Attorney, Agent, or Firm*—Sughrue Mion, PLLC

(57) ABSTRACT

In a method of manufacturing a photo mask blank by forming an opaque film or a semi-transmission film on a transparent substrate, the film is subjected to irradiation of an ion generated by an ion source. A warp of the substrate by a film stress can be reduced (the film stress is relaxed), and density and denseness of the film can be enhanced. The film may be deposited on the transparent substrate by a sputtering method.

7 Claims, 1 Drawing Sheet

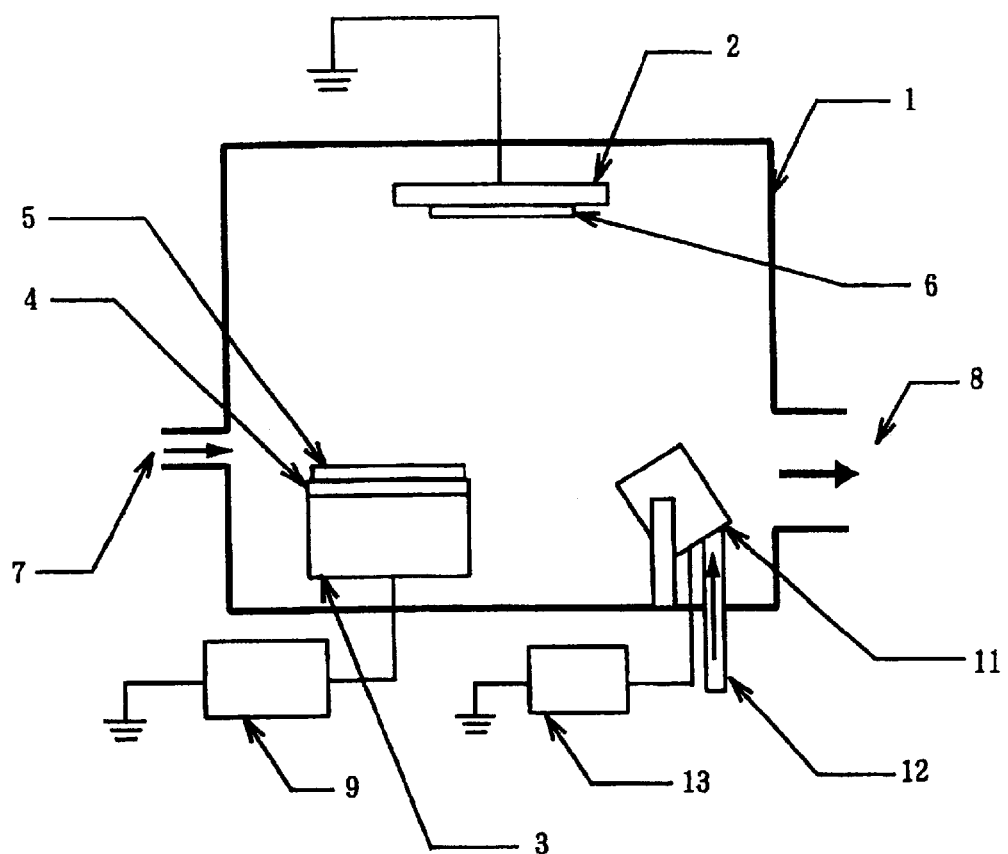

PHOTO MASK BLANK AND METHOD OF MANUFACTURING THE SAME

BACKGROUND OF THE INVENTION i) Field of the Invention

The present invention relates to a photo mask for use in manufacturing a semiconductor integrated circuit, and the like, a photo mask blank as a material of the photo mask, and a method of manufacturing the photo mask blank.

ii) Description of the Related Art

In manufacturing of semiconductors such as a semiconductor element, IC and LSI, a manufacturing process of a photo mask for use in transferring a fine pattern onto a semiconductor wafer usually includes: a film forming step of forming films, such as an opaque film, a semi-transmission film (a translucent film), onto a transparent substrate obtained by precisely polishing synthetic quartz glass by sputtering, and the like; a resist coating step of coating a resist film on the films, such as the opaque film, by a spin coating method; an exposure step (delineating step) of irradiating a resist surface with an electron ray or a laser beam to selectively expose the resist film; a development step of developing the exposed resist film with a predetermined developer to form a resist pattern; an etching step of using the resist pattern as a mask to etch the films such as the opaque film and to obtain a predetermined opaque film pattern, and the like. In this case, the substrate thus obtained by the film forming step is generally called a photo mask blank.

Here, in the forming step of forming the opaque film, usually from a viewpoint of productivity, the film is formed by a usual DC magnetron sputtering method by using a DC magnetron sputtering apparatus and a chromium target. Alternatively, a thin film is formed by a reactive sputtering method executed by introducing at least one of gases such as nitrogen and oxygen.

Chromium or a chromium compound is used as the opaque film in an original sheet of the photo mask, that is, a binary photo mask blank, in which light intensity modulation is used to transfer the pattern. In addition, the sputtering method is mainly utilized as a method for forming the opaque film onto the substrate. However, when the opaque film such as a chromium film is formed by the sputtering method, the opaque film usually has a tensile stress, and the photo mask blank including the transparent substrate as a base therefore warps. Such warps bring about a high possibility of an insufficient focus depth for exposure or a design defect. This results in deterioration of the photo mask blank. Here, for a warp amount of the substrate, the substrate is measured by flatness measuring instrument by an optical interferometer, such as FM200 manufactured by TROPEL Co. In this case, a difference of height (P-V value) between a highest point and a lowest point from a level surface of the substrate is measured before and after the film formation, and the warp amount of the substrate generated by the film formation is defined by the difference of the P-V value before and after the film formation. That is, definition is made by:

(warp amount of substrate after film formation)−(warp amount of substrate before film formation)=(warp amount of substrate generated by film formation).

As a stress reduction method of the opaque film, there is a method of applying a bias on a substrate side during sputtering deposition and implanting an ion present in plasma. However, since the photo mask blank has a relatively large film formation area, and the substrate is a dielectric such as glass, it is difficult to obtain a uniform effect in the surface.

On the other hand, when a chromium compound thin film is formed as the opaque film, or a compound thin film such as MoSiN, MoSiON, SiON, SiN is formed as a semi-transmission film (phase shifter film), the film is usually formed by the reactive sputtering method such as the DC magnetron sputtering. However, during the film formation, the compound is also deposited on the surface of a target, and electric discharge becomes unstable (as a result, particles are generated by abnormal discharge). Therefore, there is a problem that a defect is liable to occur in the photo mask blank. Furthermore, the reactive sputtering method has a lower deposition rate and therefore has a problem of a bad productivity, as compared with the usual non-reactive DC magnetron sputtering method.

When the compound target is used to form the film by an RF magnetron sputtering method instead of the DC magnetron sputtering method, plasma during the film formation is widely spread as compared with the DC magnetron sputtering method. Therefore, the film is undesirably deposited inside a chamber, and acts as a generation source of particles on the mask blank and, as a result, there arises a problem that the defect is liable to occur in the photo mask blank.

Moreover, in consideration of precision of a size recently required for the mask pattern, it has been necessary to thin a resist and opaque film during pattern formation. However, in a thin film forming method that uses the conventional DC magnetron sputtering method, the chromium film is inferior to a bulk film in density and denseness. As a result, a sufficient optical density cannot be obtained, and a demand for thin film formation cannot be satisfied.

SUMMARY OF THE INVENTION

The present invention has been developed to solve the aforementioned problems, and a first object thereof is to reduce a warp of a substrate by a film stress generated in a photo mask blank (relax and control the film stress).

Moreover, a second object of the present invention is to thin a film by enhancement of density and denseness, particularly to thin an opaque film by enhancement of a shielding property, and to enhance resistance to chemicals and resistance to light by enhancement of denseness.

Furthermore, a third object of the present invention is to reduce film defects by reduction of particles by abnormal discharge in a reactive DC sputtering method or by reduction of the particles in a reactive RF sputtering method during formation of a compound opaque film or a compound semi-transmission film by a reactive sputtering method, and to enhance a deposition rate (enhance productivity) by acceleration of reactivity (promotion of reactivity).

Additionally, a fourth object of the present invention is to provide a high-quality photo mask blank and photo mask prepared in consideration of the aforementioned objects.

To achieve the aforementioned objects, the present invention has the following constitutions.

(Constitution 1) A method of manufacturing a photo mask blank for forming an opaque film or a semi-transmission film on a transparent substrate, the method comprising a step of forming the opaque film or the semi-transmission film onto the substrate by irradiating the substrate with an ion generated by an ion generator separately disposed in a film formation chamber during the deposition of the opaque film or the semi-transmission film on the transparent substrate by a sputtering method.

(Constitution 2) The method of manufacturing the photo mask blank according to Constitution 1, wherein the step comprises controlling a film stress of the opaque film formed on the substrate; defining (a warp amount of the substrate after film formation)−(a warp amount of the substrate before the film formation)=(a warp amount of the substrate generated by the film formation); and suppressing the warp amount of the substrate generated by the film formation to ±0.1 μm or less.

(Constitution 3) The method of manufacturing the photo mask blank according to Constitution 1 or 2, wherein the step comprises directly introducing an inert gas into the ion generator from the outside of the film formation chamber; and ionizing the inert gas by the ion generator and irradiating the substrate with the ion.

(Constitution 4) The method of manufacturing the photo mask blank according to Constitution 1 or 2, wherein the step comprises directly introducing a reactive gas into the ion generator from the outside of the film formation chamber; and ionizing the reactive gas by the ion generator and irradiating the substrate with the ion.

(Constitution 5) A photo mask blank is prepared by the method according to any one of Constitutions 1 to 4.

(Constitution 6) A photo mask is prepared by using the photo mask blank according to Constitution 5.

According to Constitution 1, the opaque film or the semi-transmission film is formed onto the substrate by the sputtering method, and the substrate is irradiated with the ion generated by the ion generator (hereinafter referred to an ion source) separately disposed in the film formation chamber (a film material being deposited on the substrate is irradiated), so that density and denseness of a thin film can be enhanced. Thereby, the opaque film can obtain an effect that the opaque film can be thinned by enhancing a shielding property by the enhancement of density and denseness and that chemical durability can be enhanced by the enhancement of denseness. Moreover, the semi-transmission film (phase shifter film) can obtain an effect that the semi-transmission film is thinned by the enhancement of density and denseness, and the chemical durability, irradiation durability, and the like are enhanced by the enhancement of denseness. In this case, when an irradiation energy of the ion emitted from the ion source is raised, the density and denseness can be enhanced.

Moreover, according to Constitution 1, since the substrate is directly irradiated with the ion from the ion source during sputtering deposition, it is possible to control a film stress. Thereby, for the opaque film, it is possible to relax or control the stress of the opaque film. Concretely, for example, a Cr film formed by sputtering without ion irradiation has a tensile stress. However, according to the present invention, the substrate is directly irradiated with the ion from the ion source during the sputtering deposition, and the irradiation energy is controlled, so that the tensile stress can be reduced, also be controlled to be zero, or further be controlled to be on a compressive stress side. Moreover, for the semi-transmission film (phase shifter film), it is possible to control the stress of the semi-transmission film.

When heat treatment is not performed as described later, the irradiation energy is preferably controlled in consideration of the reduction effect of stress and the enhancement effect of density.

Furthermore, according to Constitution 1, in a film formation process of the compound opaque film or the compound semi-transmission film by the reactive sputtering method, the substrate is directly irradiated with the ion from the ion source during the sputtering deposition. Thereby, reaction is accelerated (promoted) in the vicinity of the substrate and efficiently carried out. Therefore, deposition rate can be raised and productivity can be enhanced as compared with a conventional reactive sputtering method in which the substrate is not irradiated with the ion from the ion source.

In the present invention, a preferable type of the ion source may irradiate ions of a high current density and low energy so as to establish a purpose of improvement of a film quality, and, specifically, may be, for example, an RF type, end hall type, Kaufmann type, and ECR type, but this invention is not limited to the above-mentioned types of ion sources.

According to Constitution 2, the method of Constitution 1 is used to control the stress of the opaque film formed on the substrate, and it is possible to suppress the warp amount of the substrate generated by the film formation to ±0.1 μm or less, assuming that (the warp amount of the substrate after the film formation)−(the warp amount of the substrate before the film formation)=(the warp amount of the substrate generated by the film formation).

In Constitution 2, the method of Constitution 1 is used to control the stress of the opaque film or the semi-transmission film formed on the substrate. Furthermore, the stress of the opaque film or the semi-transmission film is controlled by applying thermal treatment or laser irradiation treatment. Thereby, it is possible to suppress a change amount or a variable from a warp state measured before the film formation to ±0.1 μm or less, assuming that (the warp amount of the substrate after the thermal treatment or the laser irradiation treatment)−(the warp amount of the substrate before the film formation)=(the change amount from the warp state measured before the film formation).

Concretely, for example, when the irradiation energy of the ion source is changed, the stress of the opaque film is controlled to be on the compressive stress side. When the film is subjected to the thermal treatment or the laser irradiation treatment, the stress of the opaque film can be reduced and controlled to be in the vicinity of zero. Additionally, the ion irradiation energy can be controlled by a beam acceleration voltage and anode current. Moreover, for example, when the stress of the semi-transmission film is a compressive stress, the film is subjected to the thermal treatment or the laser irradiation treatment, and the stress of the semi-transmission film can be reduced or controlled to be in the vicinity of zero. In this case, it is unnecessary to control the irradiation energy of the ion source with a good balance with the stress reduction effect as described above. It is possible to aim only at the enhancement of the density, when the irradiation energy of the ion source is controlled. Therefore, the density can further be enhanced.

Additionally, a thermal treatment temperature is preferably 150° C. or more, 200° C. or more, 250° C. or more, 300° C. or more, 350° C. or more, 380° C. or more, or 550° C. or more. In this case, when the thermal treatment temperature is higher, an internal stress can be reduced, but a change amount of transmittance also increases. Additionally, when the temperature is excessively raised, a time of temperature rise or drop is lengthened. This causes a problem of deteriorated productivity. Therefore, the thermal treatment temperature is preferably 700° C. or less. A thermal treatment time may be, for example, one minute or more as long as heat is conducted through the entire semi-transmission film within this time.

An atmosphere for the thermal treatment preferably includes no reactive atmosphere such as oxygen. If the reactive atmosphere is included, a composition of a film thickness direction is changed by the thermal treatment. Therefore, a preferable atmosphere includes inert gases such as nitrogen and argon.

Additionally, the thermal treatment may be performed after the semi-transmission film is formed on the transparent substrate (in a blank state) or after the semi-transmission film is patterned (in a mask state). Additionally, when a fine pattern is thermally treated at a high temperature, a pattern shape is possibly deteriorated. Moreover, the thermal treatment performed in the blank state has an effect that a film quality fluctuation in the subsequent baking process of the resist (200° C. or less, e.g., about 180° C.) is suppressed. In order to obtain the effect, the film is preferably thermally treated at a temperature which is higher than the baking temperature of the resist (e.g., 200° C. or more).

According to Constitution 3, the inert gas is directly introduced into the ion generator from the outside of the film formation chamber and ionized by the ion generator, and the substrate is irradiated with the ion. Thereby, the inert gas ion can efficiently be supplied to the substrate as compared with introduction of the inert gas only via a sputtering gas introducing port. Therefore, the aforementioned reduction effect of the film stress and the enhancement effect of the film density can further be raised.

According to Constitution 4, the reactive gas is directly introduced into the ion generator from the outside of the film formation chamber and ionized by the ion generator, and the substrate is irradiated with the ion. Thereby, the reactive gas ion can efficiently be supplied to the substrate as compared with the introduction of the reactive gas only via the sputtering gas introducing port. Therefore, a reaction speed can further be enhanced, the aforementioned reduction effect of the film stress and the enhancement effect of the film density can further be raised, and controllability of the film is also satisfactory. Moreover, when the reactive gas is introduced only via a gas introducing port for the ion source, an amount of the reactive gas to be introduced into the film formation chamber can be reduced as compared with the introduction of the reactive gas only via the sputtering gas introducing port. As a result, since generation of the compound on the target can be inhibited, abnormal discharge in the reactive DC sputtering method can be reduced. Moreover, the film is inhibited from being deposited inside the chamber, the particles in the reactive RF sputtering method can be reduced, and this can reduce the film defects.

According to Constitutions 5, 6, there can be provided a high-quality photo mask blank and photo mask prepared in consideration of various factors. Such factors may be, for example, the reduction of warp of the substrate, thinning of the film by the enhancement of density and denseness, enhancement of chemical durability and irradiation durability by the enhancement of denseness, reduction of film defects during preparation of the compound opaque film or the compound semi-transmission film by the reactive sputtering method, and the like.

BRIEF DESCRIPTION OF THE DRAWINGS

A sole FIGURE is a schematic diagram of an internal constitution of an apparatus according to an embodiment of the present invention.

DETAILED DESCRIPTION OF THE PREFERRED EMBODIMENTS

EXAMPLE 1

Examples of the present invention will be described hereinafter in detail with reference to the drawing.

In an apparatus shown in the FIGURE, an ion source 11 is located in a vacuum chamber 1 of a general DC magnetron sputtering apparatus. In the chamber 1, disposed are a magnetron cathode 3 with a chromium target 5 having a size of Φ6 inches and thickness of 5 mm disposed thereon, a synthetic quartz substrate 6 having a size of six inches square and thickness of 0.25 inches, and the ion source 11 of an end hail type. As illustrated in the FIGURE, a backing plate 4 is interposed between the magnetron cathode 3 and the chromium target 5 while the substrate 6 ids placed on the anode 2. The ion source 11 is disposed at an appropriate angle so that the substrate 6 is irradiated with an ion. In this case, a distance of a straight line connecting a target center to a substrate surface center is 23 cm, and a distance of a straight line connecting the ion source to the substrate surface center is 16 cm. Moreover, the inside of the chamber was evacuated through an outlet port 8 to a degree of vacuum of $1\times10^{-4}$ Pa by an exhaust pump.

Subsequently, an argon gas was introduced via a sputtering gas introducing port 7, and a gas introducing port 12 for the ion source, respectively, so that the inside of the chamber 1 indicated 0.11 Pa. A power of 300 W was applied to the cathode 3 by a sputtering DC power source 9. Additionally, the substrate 6 was irradiated with an argon ion from the ion source 11 on conditions that a beam acceleration voltage was 60 V and an anode current was 0.8 A (under control by an anode and cathode power source controller 13 for the ion source), and an opaque film was formed or deposited to a film thickness of 80 nm.

As a result of checking a warp state of the substrate by an optical interferometer, a change amount or a variable of 0.1 µm was given from the warp state measured before film formation ((a warp amount of the substrate after the film formation)−(the warp amount of the substrate before the film formation)=(the warp amount of the substrate generated by the film formation)). In this event, a film stress was a tensile stress. Furthermore, the film was formed on similar conditions, only by changing irradiation conditions such that the beam acceleration voltage was 80 V and anode current was 1 A. As a result, the warp amount of the substrate generated by the film formation was 0.1 µm, and the film stress was a compressive stress. That is, when the irradiation conditions of the ion source are controlled, the film stress can be adjusted to a compressive stress side from a tensile stress side, and the resultant film stress can be adjusted to be zero or in the vicinity of zero.

COMPARATIVE EXAMPLE 1

Comparative example 1 used an apparatus constitution free from the ion source of Example 1 mentioned above. In Comparative Example, the film was deposited to a film thickness of 80 nm on conditions that evacuation was made to a degree of vacuum of $1\times10^{-4}$ Pa, a pressure was kept at 0.11 Pa during introduction of an argon gas, with the sputtering DC power source 9 supplied from power of 300 W to the cathode 3.

When the warp amount of the substrate generated by the film formation or deposition was measured like in Example 1, the amount was 0.5 µm, and the film stress was the tensile stress.

It is seen from Example 1 and Comparative Example 1 that the present invention can improve flatness of a mask blank as compared with the conventional method.

EXAMPLE 2

In an apparatus constitution similar to that of Example 1, power of 600 W was supplied from the sputtering DC power source 9 to the cathode 3 and, simultaneously, ions were irradiated from the ion source 11 towards the substrate 6 on conditions that a beam acceleration voltage was 80 V and anode current was 1 A. Thus, the film was deposited to a thickness of 41 nm and had an optical density (O.D.) of 3 for a wavelength of 193 nm.

Moreover, the film was deposited to a film thickness of 1 μm on the aforementioned film formation conditions and, thereafter, measurement was made about weights of the substrate before and after the film formation. Density of the chromium film was calculated. As a result of calculation, the density of the chromium film was 7.1 g/cm$^3$.

Additionally, with the chromium film, the film density preferably falls in a range of 95 to 100%, particularly preferably 98% or more of a bulk density (7.2 g/cm$^3$).

COMPARATIVE EXAMPLE 2

Comparative Example 2 was prepared to be compared with Example 2. In this event, any ion source (illustrated in the FIGURE) was not used in the apparatus constitution in the FIGURE. Evacuation was made to a degree of vacuum of 1×10$^{-4}$ Pa, the gas pressure was 0.11 Pa during the introduction of the argon gas, the sputtering DC power source 9 applied power of 600 W to the cathode 3. Thus, the film was formed and had the optical density (O.D.) of 3 for the wavelength of 193 nm. The resultant film thickness was 45 nm.

Moreover, the film was deposited to a film thickness of 1 μm on the aforementioned film formation conditions, and the density of the film was calculated from the weights of the substrate before and after the film formation. As a result, the film density was 6.7 g/cm$^3$.

EXAMPLE 3

The chromium film was formed to a thickness of 65 nm on the synthetic quartz substrate 6 having a size of six inches and thickness of 0.25 inch with the apparatus constitution and film formation conditions similar to those of Example 1. Subsequently, 50 sccm of the argon gas was introduced onto the chromium film via the sputtering gas introducing port 7, the sputtering DC power source 9 applied the power of 300 W to the cathode 3, and this caused a sputtering discharge to occur. Moreover, during the sputtering discharge, a mixture gas containing 4 sccm of a nitrogen gas and 0.5 sccm of an oxygen gas was introduced via the gas introducing port 12 for the ion source. The substrate 6 was irradiated with a nitrogen ion and oxygen ion from the ion source 11 on conditions that the acceleration voltage was 160 V and the anode current was 1A, and an anti-reflection was formed to a thickness of 28 nm.

As a result of observation of DC magnetron sputtering discharge, an abnormal discharge was not observed.

COMPARATIVE EXAMPLE 3

Comparative Example 3 was prepared to be compared with Example 3. In Comparative Example 3, the apparatus constitution was used without any ion source of Example 1. In this event, the chromium film was deposited to a thickness of 65 nm, and a film having an anti-reflection effect equal to that of Example 3 was formed as an anti-reflection layer by the DC magnetron sputtering method without ion irradiation.

In Comparative Example 3, a flow rate of the argon gas was 38.4 sccm, that of the nitrogen gas was 10 sccm, and that of the oxygen gas was 1.6 sccm. Furthermore, the abnormal discharge was observed in the vicinity of the target during discharge. As a result, particles adhered onto the substrate with the film deposited thereon, and it was impossible to form a high-quality photo mask blank.

It is seen from Example 3 and Comparative Example 3 that an amount of the reactive gas to be introduced into the film formation chamber only via the gas introducing port for the ion source can be reduced as compared with the introduction of the reactive gas only via the sputtering gas introducing port. As a result, since generation of a compound on the target can be suppressed, and the abnormal discharge in the reactive DC sputtering method can be reduced. This shows that film defects can be reduced.

EXAMPLE 4

In an apparatus constitution which was similar to that of Example 1 and in which a silicon target was disposed as the target 5, 20 sccm of the argon gas was introduced onto the synthetic quartz substrate 6 having a size of six inches and thickness of 0.25 inch via the sputtering gas introducing port 7, and 5 sccm of the nitrogen gas was introduced via the gas introducing port 12 for the ion source. Thereby, the gas pressure in the chamber 1 was kept at 0.1 Pa. Power of 200 W was applied to the cathode 3, the sputtering discharge was thus caused to occur, and the substrate 6 was irradiated with the nitrogen ion from the ion source 11 on conditions that the acceleration voltage was 100 V and anode current was 1.1 A during the sputtering discharge.

A thickness of an SiN film was adjusted so that a phase angle became 180 degrees for a wavelength of 193 nm, and the film was formed. A spectral photometer was used to measure the formed SiN film, and a transmittance was 4.9% for the wavelength of 193 nm. Additionally, a transmittance of a semi-transmission film is preferably in a range of 3% to 20%.

COMPARATIVE EXAMPLE 4

With respect to Example 4, Comparative Example 4 was prepared by using an apparatus constitution in which the ion source of Example 1 was not used and the silicon target was disposed instead of the chromium target. In this case, 20 sccm of the argon gas and 5 sccm of the nitrogen gas were introduced via the sputtering gas introducing port 7, and the power of 200 W was applied to the cathode 3 from the sputtering DC power source 9. Like in Example 4, the film thickness was adjusted in order to obtain the phase angle of 180 degrees and the film was formed. When the spectrometer was used to measure the transmittance in the wavelength of 193 nm, the transmittance was 0.1%. Therefore, the transmittance was inappropriately outside the range of 3% to 20%.

It is seen from Example 4 and Comparative Example 4 that in the introduction of the reactive gas only via the gas introducing port for the ion source, the reactive gas ion can efficiently be supplied to the substrate as compared with the introduction of the reactive gas only via the sputtering gas introducing port. As a result, it is seen that the transmittance of the semi-transmission film can be improved by the enhancement of density and denseness.

EXAMPLE 5

In an apparatus constitution similar to that of Example 4, 10 sccm of the argon gas via the sputtering gas introducing port 7 and 5 sccm of the nitrogen gas via the gas introducing port 12 for the ion source were introduced onto the synthetic quartz substrate 6 having a size of six inches and thickness of 0.25 inch in the chamber 1, and the gas pressure in the chamber 1 was set to 0.11 Pa. Power of 600 W was applied to the cathode 3 from the DC power source 9, the sputtering discharge was thus caused to occur, and the substrate 6 was irradiated with the nitrogen ion from the ion source 11 on conditions that the acceleration voltage was 150 V and anode current was 1.1 A during the sputtering discharge. The thickness of the SiN film was adjusted so that the phase angle was 180 degrees for 193 nm, and the film was formed.

The spectrometer was used to measure the transmittance and reflectance of the formed SiN film and to calculate, from experimental results, a refractive index n and an extinction coefficient k for the wavelength of 193 nm. As a result, n=2.6, k=0.46. Furthermore, in this case, the film deposition rate was checked, and was found to be 60 nm/min.

COMPARATIVE EXAMPLE 5

With respect to Example 5, Comparative Example 5 was prepared by using an apparatus constitution in which the ion source of Example 4 was not used. In this case, a nitrogen flow rate was adjusted, so that 10 sccm of the argon gas and 10 sccm of the nitrogen gas were introduced via the sputtering gas introducing port 7 in order to obtain the same phase angle and transmittance as those of Example 5. The power of 200 W was applied to the cathode 3 from the DC power source 9, and the SiN film having the same phase angle and transmittance as those of Example 5 was formed.

Like in Example 5, the film deposition rate was checked, and was 20 nm/min in Comparative Example.

It is seen from Example 5 and Comparative Example 5 that, in the introduction of the reactive gas only via the gas introducing port for the ion source, the reactive gas ion can efficiently be supplied to the substrate as compared with the introduction of the reactive gas only via the sputtering gas introducing port, and as a result, the film deposition rate and productivity can be enhanced.

Moreover, the semi-transmission film obtained in Example 5 was superior to the semi-transmission film obtained in Comparative Example 2 in denseness, chemical durability, and irradiation durability.

Furthermore, when the semi-transmission film obtained in Example 5 was thermally treated, it was possible to remarkably reduce the compressive stress of the film as compared with the semi-transmission film obtained in

COMPARATIVE EXAMPLE 2.

The preferred examples of the present invention have been described, but the present invention is not limited to the aforementioned examples.

For example, the target may be disposed opposite to the substrate right under the substrate. Moreover, a plurality of targets may be offset from right under the substrate, and arranged in the film formation chamber. Further, the substrate can rotate itself.

The ion source may be disposed in any position in which the substrate can be irradiated with the ion.

Even with use of an apparatus in which RF sputtering is performed instead of DC sputtering, the ion source may be disposed, and the similar effect can be obtained.

According to the present invention, the warp of the substrate by the film stress generated in the photo mask blank can be reduced (the film stress is relaxed and controlled). Moreover, it is possible to thin the film by the enhancement of density and denseness, particularly to thin the opaque film by enhancement of a shielding property, and to enhance chemical durability, irradiation durability, and the like by the enhancement of denseness. Furthermore, it is possible to reduce film defects by reduction of abnormal discharge and by reduction of particles in forming the compound opaque film or the compound semi-transmission film by the reactive sputtering method, and to enhance the deposition rate (enhance the productivity) by acceleration of reactivity (promotion of reactivity).

Therefore, it is possible to provide a higher-quality photo mask blank as compared with a conventional photo mask blank.

What is claimed is:

1. A method of manufacturing a photo mask blank by forming an opaque film or a semi-transmission film on a transparent substrate, said method comprising a step of:

forming said opaque film or said semi-transmission film onto the substrate by irradiating the substrate with anion generated by an ion generator separately disposed in a film formation chamber during the deposition of the opaque film or the semi-transmission film on the transparent substrate by a sputtering method.

2. The method claimed in claim 1, wherein said step comprises:

controlling a film stress of the opaque film or semi-transmission film formed on the substrate;

defining (a warp amount of the substrate after film formation)–(a warp amount of the substrate before the film formation)=(a warp amount of the substrate generated by the film formation); and suppressing the warp amount of the substrate generated by the film formation to ±0.1 μm or less.

3. The method claimed in claim 1, wherein said step comprises:

directly introducing an inert gas onto the ion generator from the outside of the film formation chamber; and ionizing said inert gas by the ion generator to irradiate the substrate with the ion.

4. The method claimed in claim 1, wherein said step comprises:

directly introducing a reactive gas into the ion generator from the outside of the film formation chamber; and ionizing said reactive gas by the ion generator and irradiating the substrate with the ion.

5. A method of reducing a stress of a film formed on a substrate, comprising the steps of:

disposing an ion generator in a chamber together with the substrate; and irradiating, onto the substrate during depositing the film, an ion generated by an ion generator to relax the stress in the film.

6. The method claimed in claim 5, further comprising the steps of:

measuring a warp of the substrate to define a warp amount;

calculating the stress on the basis of the warp amount; and adjusting an irradiation condition with reference to the calculated stress so as to keep the stress into a predetermined range.

7. The method claimed in claim 6, wherein the predetermined range falls within ±0.1 μm.

* * * * *